United States Patent [19]

Gura

[11] Patent Number: 5,778,692
[45] Date of Patent: Jul. 14, 1998

[54] ALLOCATION OF COMPRESSORS TO COOLING CHAMBERS

[75] Inventor: Gerald A. Gura, Charlotte, N.C.

[73] Assignee: International Business Machines Corporation, Armonk, N.Y.

[21] Appl. No.: 699,905

[22] Filed: Aug. 20, 1996

[51] Int. Cl.$^6$ .................... F25B 7/00; F25B 1/10
[52] U.S. Cl. .................... 62/175; 62/510
[58] Field of Search ............... 62/175, 510; 236/1 EA; 417/3, 4

[56] References Cited

U.S. PATENT DOCUMENTS

| | | | |
|---|---|---|---|
| 2,274,774 | 3/1942 | Chambers | 62/175 |
| 2,336,671 | 12/1943 | Chambers | 62/175 |
| 4,084,388 | 4/1978 | Nelson | 236/1 EA |
| 4,854,726 | 8/1989 | Lesley et al. | 374/45 |
| 4,881,591 | 11/1989 | Rignall | 364/557 X |
| 4,925,089 | 5/1990 | Chaparro et al. | 236/78 D |
| 5,226,472 | 7/1993 | Benevelli et al. | 62/217 X |
| 5,247,989 | 9/1993 | Benevelli | 62/217 X |
| 5,440,894 | 8/1995 | Schaeffer et al. | 62/510 X |

FOREIGN PATENT DOCUMENTS 0174841  7/1989  Japan ..................... 62/175

*Primary Examiner*—William E. Wayner
*Attorney, Agent, or Firm*—Ratner & Prestia; Arthur J. Samodovitz, Esquire

[57] ABSTRACT

A distributed cooling system for environmentally testing products comprises at least two insulated chambers, at least three cooling compressors and a computer control. A first one of the compressors is permanently allocated to a first one of the chambers, a second one of the compressors is permanently allocated to a second one of the chambers. The control selectively allocates the remaining compressor(s) to either of the chambers to meet a cooling requirement of a batch. Consequently, the compressors are allocated where needed such that the total number of compressors provided for the entire system is minimized.

3 Claims, 5 Drawing Sheets

| RAMP RATES | NUMBER OF COMPRESSORS BEFORE AIR SET POINT | NUMBER OF COMPRESSORS AT AIR SET POINT | NUMBER OF COMPRESSORS AFTER SATURATION OF LOAD | THERMAL SATURATION TIME OF LOAD AFTER SET POINT |
|---|---|---|---|---|
| 5°/MIN | 1 | 1 | 1 | 0 MIN |
| 10°/MIN | 1 | 1 | 1 | 0 MIN |
| 15°/MIN | 2 | 2 | 1 | 4 MIN |
| 20°/MIN | 2 | 2 | 1 | 4 MIN |
| 25°/MIN | 3 | 2 | 1 | 4 MIN |
| 30°/MIN | 3 | 2 | 1 | 4 MIN |

100 XYZ PRINTED CIRCUIT BOARDS

| RAMP RATES | A | A+B | A+C | A+B+C | D | D+B | D+C | D+B+C | COMPRESSORS AT SET POINT | COMPRESSORS AFTER SATURATION OF LOAD | THERMAL SATURATION TIME AFTER SET POINT |
|---|---|---|---|---|---|---|---|---|---|---|---|
| 5°/MIN | X | | | | | | | | A OR D | A OR D | 0 |
| 10°/MIN | X | | | | | | | | A OR D | A OR D | 0 |
| 15°/MIN | | X | X | | | | | | A, B OR C, D | A OR D | 4 |
| 20°/MIN | | X | X | | | | | | A, B OR C, D | A OR D | 4 |
| 25°/MIN | | | | X | | | | X | A, B OR C, D | A OR D | 4 |
| 30°/MIN | | | | X | | | | X | A, B OR C, D | A OR D | 4 |

100 XYZ PRINTED CIRCUIT BOARDS

ALLOCATION OF COMPRESSORS TO COOLING CHAMBERS

BACKGROUND OF THE INVENTION

The invention relates generally to cooling apparatus used for environmental testing or production, and deals more particularly with a technique to tailor cooling capacity to variable cooling requirements.

Some products require environmental testing before shipment to expose latent defects. For example, it may be required to cool a printed circuit board at a predetermined ramp rate to a predetermined temperature to reveal solder defects, component defects, assembly defects, etc. before the product is approved for shipping. Other products may require cooling as an actual stage in production. For both the test and production applications, a large number of the same product are typically loaded into a cooling chamber for batch testing or production.

It was known to provide a fixed number of compressors for each cooling chamber. With such an arrangement, the maximum number of product that can be loaded into the cooling chamber for batch testing or production may be limited by the cooling capacity of the compressors or space capacity of the chamber. If the cooling capacity of the compressors allocated to the chamber exceeds the cooling ramp rate requirement, then cooling capacity is wasted.

It was also known to provide two cooling chambers for each compressor or group of compressors and operate the cooling chambers in a complimentary manner, i.e. one at a time. This avoids the down time present with the single cooling chamber associated with unloading the cooled products from the cooling chamber after test or production and loading new product into the cooling chamber for subsequent test or production. However, this technique does not avoid the waste if the cooling capacity of the chambers exceeds the cooling ramp rate requirement.

A general object of the present invention is to provide a technique to tailor cooling capacity to cooling requirements.

SUMMARY OF THE INVENTION

The present invention resides in a cooling system for environmental test or production purposes. The system comprises at least two insulated chambers, at least three cooling compressors and a computer control. The control selectively allocates a minimum number of the compressors to either of the chambers to meet a cooling requirement of a batch. Because the compressors can be selectively allocated to either chamber as needed, the total number of compressors in the entire system is minimized.

According to one feature of the present invention, a first one of the compressors is permanently allocated to a first one of the chambers, a second one of the compressors is permanently allocated to a second one of the chambers, and the allocating means selectively allocates a third one of the compressors to the first or second chambers as needed to meet a respective cooling requirement.

BRIEF DESCRIPTION OF THE FIGURES

FIG. 4 is another table stored in computer memory and used by the distributed cooling system of FIG. 1.

DETAILED DESCRIPTION OF THE PREFERRED EMBODIMENTS

Figure 1:
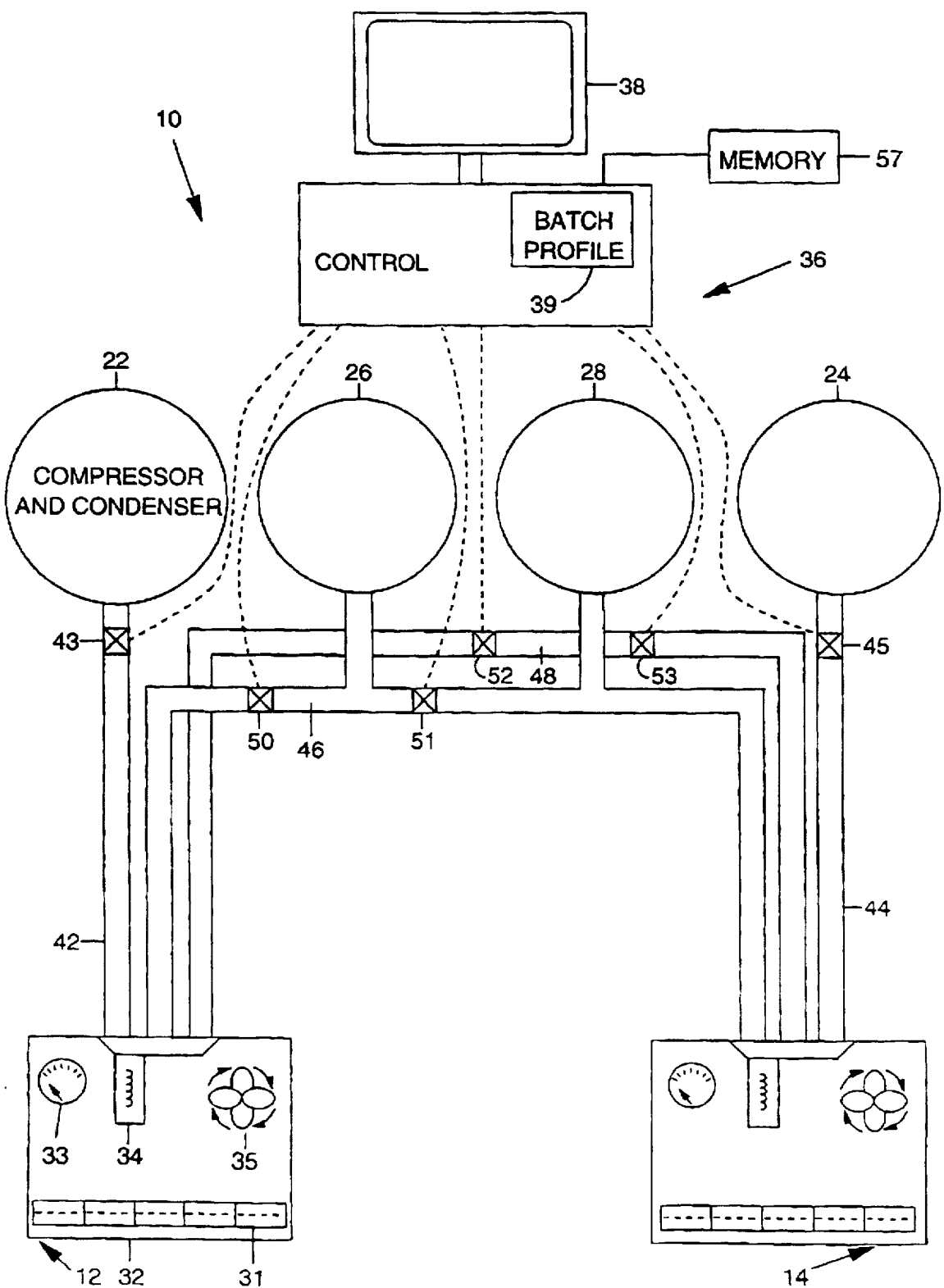
FIG. 1 is a block diagram of a distributed cooling system according to the present invention.

Referring now to the drawings in detail wherein like reference numbers indicate like elements throughout, FIG. 1 illustrates a distributed cooling system generally designated 10 according to the present invention. System 10 comprises two cooling chambers 12 and 14 and four sets 22, 24, 26 and 28 of cooling compressors and respective condensers (although more cooling chambers and cooling compressors can be provided if desired). Each cooling chamber comprises a thermally insulating enclosure 32, a thermometer 33, an evaporator coil and expansion valve collectively labeled 34 and a fan 35 to blow warm air over the evaporator coil 34. For tests involving printed circuit boards, each cooling chamber also includes electrical "hook-ups" 31 to interconnect and power-up the printed circuit boards after the test to determine if the printed circuit boards survived the test without damage. Compressor 22 is permanently allocated to chamber 12 via a duct 42 leading to the respective evaporator coil, and compressor 24 is permanently allocated to chamber 14 via a duct 44 leading to the respective evaporator coil. Each duct 42 and 44 includes a respective valve 43 and 45 to control the amount of refrigerant which passes from the compressor to the respective evaporator coil. Each of the other compressors 26 and 28 has bifurcated ducts 46 and 48, respectively leading to both chambers and respective pairs of valves 50,51 and 52,53 to select one or the other or neither chamber, and also control the amount of refrigerant which passes from the compressor to the selected cooling chamber. System 10 also includes a computer control 36 for selectively allocating compressors 26 and 28 to chambers 12 or 14 and control the valves, as needed for the current batch.

Figure 2A:
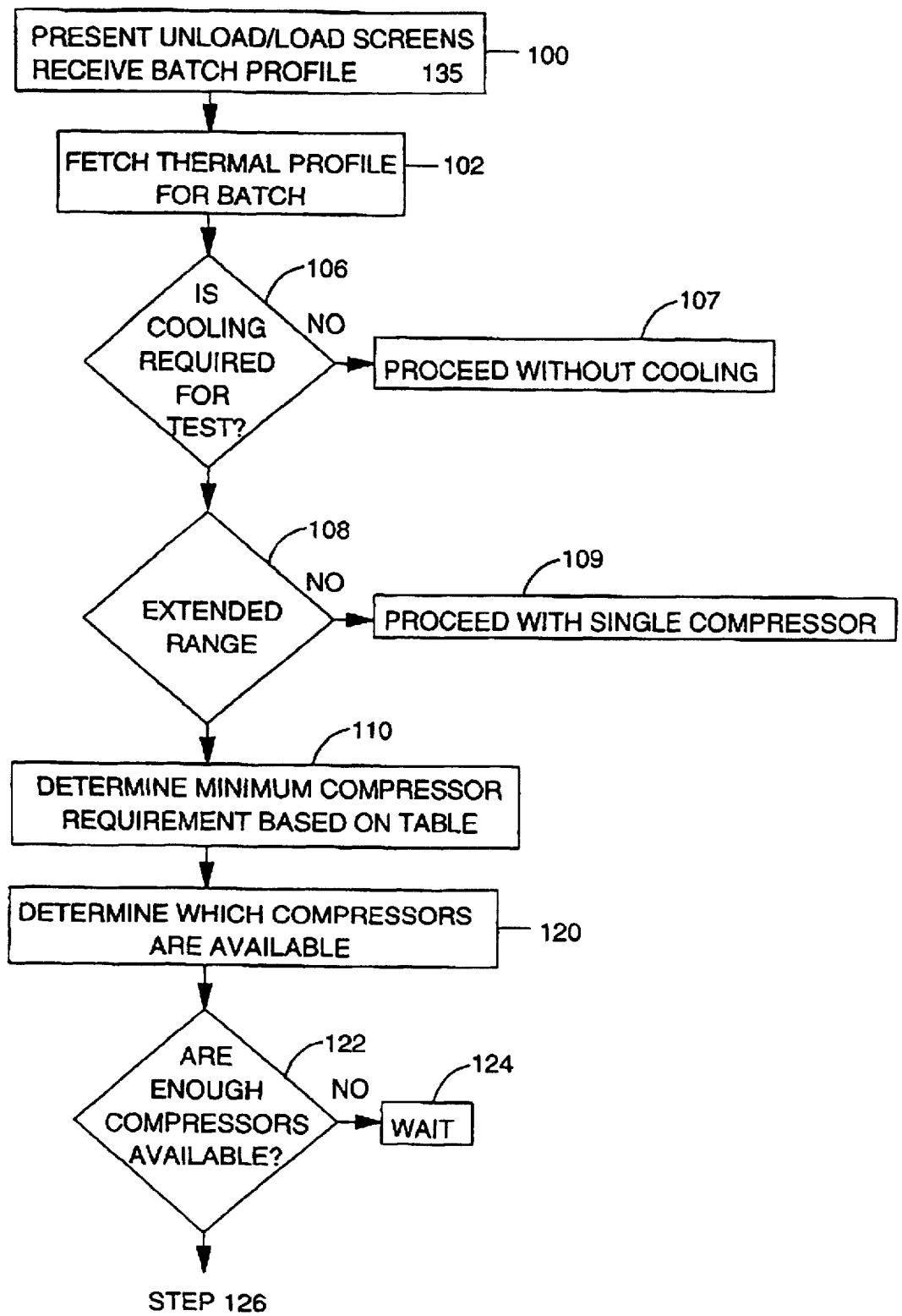
FIGS. 2(a,b) form a flow chart illustrating a process for operating the distributed cooling system of FIG. 1.
Figure 2B:
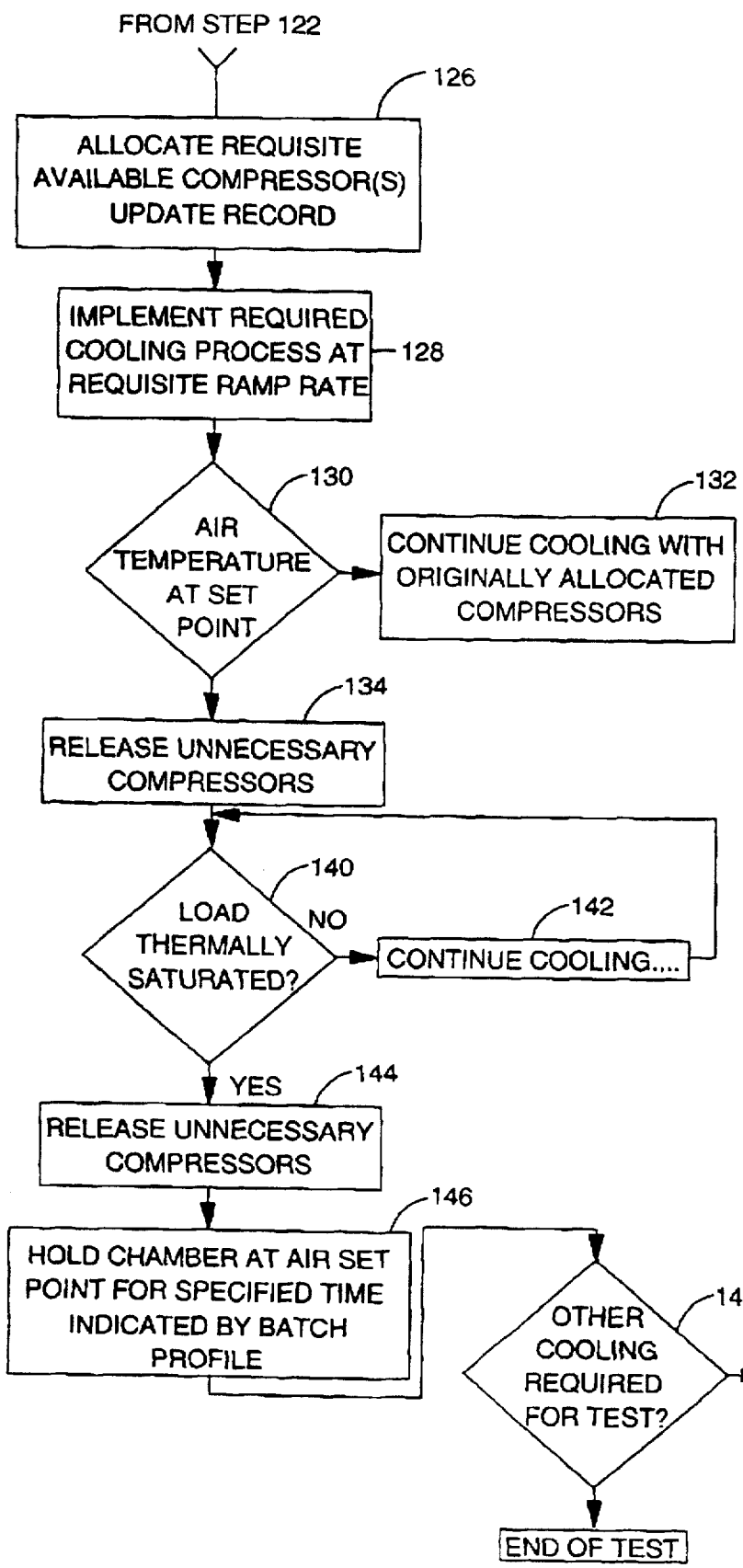
Figure 3:
FIG. 3 is a table stored in computer memory and used by the distributed cooling system of FIG. 1.

Control 36 operates according to the flow chart of FIGS. 2(a,b). At the beginning of operation (step 100), the control 36 presents a set of screens 38 to the user which guides the user through a process for manually unloading the batch that was just tested and loading the next batch for testing. In this example, chamber 12 is used. Control 36 also presents screens to permit the user to define the current test, i.e. number and type of products in the chamber. In response to the definition, control 36 fetches from memory 57 a previously stored test procedure for the product (step 102), for example, cool the product at fifteen degrees per minute to thirty degrees Fahrenheit and hold the product at thirty degrees Fahrenheit for one hour. Assuming the test procedure requires cooling (decision 106), control 36 determines if the fetched test procedure requires a nominal or extended range of cooling. (Otherwise, in step 107, testing proceeds without cooling.) This determination is based on one of many tables such as Table 111 stored in memory 57 and illustrated in FIG. 3. These tables were generated by previous tests with actual products such as the current batch. There is one such table for each increment of combined product mass for products of the same general type. For example, there is one table for one hundred pounds of printed circuit boards of any type and another table for one hundred fifty pounds of printed circuit boards of any type. However, for substantially different types of products, such as semiconductor chips alone, there is a different set of tables. If a current test involves a combined product mass which lies between that of two tables, then the table for the next higher increment of product mass is used. The first column of Table 111 lists various (average) ramp rates. Each ramp rate is a rate of cooling in degrees per minute, for example, 5 degrees per minute, 10 degrees per minute, 15 degrees per minute, etc. In the case where all compressors have the same cooling capacity, a second column in Table 111 indicates the minimum number of compressors required to meet each respective ramp rate of cooling. For example, the lowest two ramp rates require only one compressor (compressor 22). The next two higher ramp rates require two compressors (compressor 22 and either compressor 26 or 28), and the next two higher ramp rates require three compressors (compressors 22, 26 and 28; However, if all the compressors do not have the same cooling capacity, then there are columns for each possible combination of compressors, and an entry in each row for those combinations of compressors having sufficient cooling power to meet the respective ramp rate. FIG. 4 illustrates such a table 113. Tables 111 and 113 also indicate the total compressor cooling power of each combination. The nominal range can be supplied by the single compressor 22 which is permanently allocated to chamber 12. The extended range requires one or more additional compressors 26 or 28. A decision is made at step 108 as to whether the normal or extended range is required. In the case of the nominal range, control 36 proceeds with the permanently allocated compressor 22 (step 109). However, in the case of the extended range, control 36 next determines the minimum compressor requirement (step 110) to meet the cooling requirement. In the illustrated embodiment, this determination is also done empirically based on tables 111 or 113.

Next, control 36 determines which of the compressors 26 and 28 are currently available based on a status record (step 120). (As noted above, compressor 22 is always allocated to chamber 12 and compressor 24 is always allocated to chamber 14.) Control 36 updates the status record whenever compressors 26 or 28 are allocated or deallocated. Next, control 36 determines if there are enough compressors to meet the cooling requirement in the case of all compressors being the same. In the case of dissimilar compressors, control 36 determines if there is a compressor combination currently available to meet the requirement (decision 122). If the requisite compressor(s) are not currently available, control 36 goes into a loop mode constantly checking the status record (step 124). However, if there are enough compressors or a suitable compressor combination currently available, then control 36 allocates the required compressor (s)—compressor 26, compressor 28 or both compressors 26 and 28 (step 126). In the case where all compressors are the same, it does not matter which additional compressors 26 and/or 28 are allocated if only one is required. In the case of dissimilar compressors, control 36 allocates the combination of compressors having the lowest combined cooling power for which all the compressors are currently available.

Next, control 36 interconnects the allocated, additional compressors 26, 28 or 26 and 28 using (solenoids, not shown, and) the associated valves, and begins the cooling operation (step 128). The duty cycle of the valves is controlled to provide the desired cooling ramp rate when the allocated compressor(s) exceed the cooling requirement. The test is complete when the product has reached the specified temperature ("set point") at the specified ramp rate and maintained there for the specified time while operated. However, the cooling of the product lags the cooling of the air temperature within the chamber, and the thermometer 33 only measures air temperature. Therefore, by reference to the thermometer in the chamber, control 36 determines when the air has reached the set point (decision 130). If the set point has not been reached, cooling continues (step 132) with the originally allocated compressors. Typically, once the air temperature has reached the set point, one or more of the additional compressors 26 or 28 can be deallocated, the remaining compressor(s) being capable of maintaining the air temperature at the set point until the load is "saturated" (to the set point) (step 134). Table 111 also includes additional columns to indicate the number of compressors that can be deallocated and the thermal saturation time of the load once the air temperature has reached set point. The information in these additional columns was also generated by previous tests. In decision 140 and step 142, the compressor(s) remaining after the air temperature has reached set point, are utilized until the load has saturated. Then, any excess compressors are deallocated (step 144). Next, the control consults batch profile 39 to determine the time that the single compressor is utilized after the load has been saturated and utilizes this compressor accordingly (step 146). Afterwards, if there are additional cooling tests required (decision 148), then control jumps to step 108. After all the tests are complete (decision 148), the user unloads the chamber and prepares for the next batch.

Based on the foregoing a distributed cooling system according to the present invention has been disclosed. However, numerous modifications and substitutions can be made without deviating from the scope of the present invention. For example, the ramp rate capability for the different combinations of compressors can be determined mathematically based on the number of BTUs of each compressor, the total mass of each batch and the thermal conductive nature of the materials within the batch. Therefore, the present invention has been disclosed by way of illustration and not limitation and reference should be made to the following claims to determine the scope of the present invention.

I claim:

1. A cooling system comprising:
   at least two insulated chambers;
   a first compressor permanently allocated to a first one of said chambers;
   a second compressor permanently allocated to a second one of said chambers;
   a third compressor selectively allocated to either said first chamber or said second chamber; and
   means, including a data base storing information indicating a minimum number of compressors required to meet a cooling requirement, for selectively allocating said third compressor to either said first chamber or said second chamber to meet a cooling requirement based on said information.

2. A cooling system comprising:
   at least two insulated chambers;
   a first compressor permanently allocated to a first one of said chambers;
   a second compressor permanently allocated to a second one of said chambers;
   a third compressor selectively allocated to either said first chamber or said second chamber; and
   means including:
   (a) a computer control, and
   (b) a data base storing information indicating a minimum number of compressors required to meet a cooling requirement for selectively allocating said third compressor to either said first chamber or said second chamber to meet a cooling requirement based on said information.

3. A system as set forth in claim 2 wherein said data base is generated empirically.

* * * * *